US008053345B2

(12) United States Patent
Ahn et al.

(10) Patent No.: US 8,053,345 B2
(45) Date of Patent: Nov. 8, 2011

(54) METHOD FOR FABRICATING FIELD EFFECT TRANSISTOR USING A COMPOUND SEMICONDUCTOR

(75) Inventors: Hokyun Ahn, Daejeon (KR); Jong-Won Lim, Daejeon (KR); Hyung Sup Yoon, Daejeon (KR); Woojin Chang, Daejeon (JP); Hae Cheon Kim, Daejeon (KR); Eun Soo Nam, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 12/773,216

(22) Filed: May 4, 2010

(65) Prior Publication Data

US 2011/0143505 A1 Jun. 16, 2011

(30) Foreign Application Priority Data

Dec. 11, 2009 (KR) .................. 10-2009-0123356

(51) Int. Cl.
*H01L 21/3205* (2006.01)
*H01L 21/44* (2006.01)

(52) U.S. Cl. ....................... 438/585; 438/671

(58) Field of Classification Search .............. None
See application file for complete search history.

(56) References Cited

U.S. PATENT DOCUMENTS

| 7,573,078 B2 | 8/2009 | Wu et al. | |
| 2007/0072377 A1* | 3/2007 | Passlack | 438/285 |
| 2010/0163936 A1* | 7/2010 | Immorlica et al. | 257/284 |
| 2010/0252882 A1* | 10/2010 | Denison et al. | 257/337 |

FOREIGN PATENT DOCUMENTS

| EP | 1 921 669 A1 | 5/2008 |
| KR | 10-0276077 B1 | 9/2000 |
| KR | 10-0695670 B1 | 3/2007 |
| KR | 10-0782430 B1 | 11/2007 |
| KR | 10-2008-0036002 A | 4/2008 |

OTHER PUBLICATIONS

Eizo Mitani et al, "Mass-Production of High-Voltage GaAs and GaN Devices", CS-MANTECH, 2006, p. 183-186(2006).
A. Chini et al, "Power and Linearity Characteristics of Field-Plated Recessed-Gate AlGaN—GaN HEMTs", IEEE Electron Device Letters, vol. 25, No. 5, p. 229-231(2004).

* cited by examiner

*Primary Examiner* — Scott B Geyer
(74) *Attorney, Agent, or Firm* — Rabin & Berdo, PC

(57) ABSTRACT

Provided is a method for fabricating a field effect transistor. In the method, an active layer and a capping layer are formed on a substrate. A source electrode and a drain electrode is formed on the capping layer. A dielectric interlayer is formed on the substrate, and resist layers having first and second openings with asymmetrical depths are formed on the dielectric interlayer between the source electrode and the drain electrode. The first opening exposes the dielectric interlayer, and the second opening exposes the lowermost of the resist layers. The dielectric interlayer in the bottom of the first opening and the lowermost resist layer under the second opening are simultaneously removed to expose the capping layer to the first opening and expose the dielectric interlayer to the second opening. The capping layer of the first opening is removed to expose the active layer. A metal layer is deposited on the substrate to simultaneously form a gate electrode and a field plate in the first opening and the second opening. The resist layers are removed to lift off the metal layer on the resist layers.

10 Claims, 5 Drawing Sheets

METHOD FOR FABRICATING FIELD EFFECT TRANSISTOR USING A COMPOUND SEMICONDUCTOR

CROSS-REFERENCE TO RELATED APPLICATIONS

This U.S. non-provisional patent application claims priority under 35 U.S.C. §119 of Korean Patent Application No. 10-2009-0123356, filed on Dec. 11, 2009, the entire contents of which are hereby incorporated by reference.

BACKGROUND OF THE INVENTION

The present invention disclosed herein relates to methods for fabricating Field Effect Transistors (FETs), and more particularly, to methods for fabricating compound semiconductor FETs.

Compound semiconductor FETs are widely used in application devices of microwave or millimeterwave (10 GHz~100 GHz) bands because they have better speed characteristics than silicon-based semiconductor devices. An FET reduces the electric field of a gate electrode and a drain electrode to achieve a high breakdown voltage. The FET may include a field plate that reduces the capacitance between the gate electrode and the drain electrode. The field plate may be formed on a dielectric layer between the gate electrode and the drain electrode.

However, the typical gate electrode is formed before the field plate. Therefore, the gate electrode and the field plate require a plurality of metal layer forming processes and a plurality of lithography processes, thus degrading the productivity.

SUMMARY OF THE INVENTION

Embodiments of the present invention provide FET fabrication methods that can increase or maximize the productivity by forming a gate electrode and a field plate simultaneously.

In some embodiments of the present invention, methods for fabricating a field effect transistor include: stacking an active layer and a capping layer on a substrate; forming a source electrode and a drain electrode on the capping layer; sequentially forming a dielectric layer and a first resist layer on the substrate; forming a second resist layer with first and second openings on the first resist layer between the source electrode and the drain electrode; exposing the dielectric layer by removing the first resist layer in the bottom of the first opening, which is adjacent to the source electrode, by a linewidth smaller than the inlet of the first opening; removing the dielectric layer in the bottom of the first opening and the first resist layer in the bottom of the second opening to expose the capping layer to the first opening and expose the dielectric layer to the second opening; and forming a gate electrode and a field plate respectively in the first opening and the second opening.

In some embodiments, the dielectric layer and the first resist layer are removed through a dry etching process.

In other embodiments, the dry etching process is performed by using a reaction gas with an etch selectivity being proportional to the thickness of the dielectric layer and the first resist layer.

In further embodiments, the reaction gas includes carbon tetrafluoride.

In still further embodiments, the dielectric layer includes at least one of a silicon oxide layer, a silicon nitride layer, a benzocyclobutene (BCB) polymer, and a silica gel.

In still further embodiments, the first resist layer includes at least one of PMMA (polymethyl methacraylate) and ZEP (copolymer of chloromethacrylate and methylstyrene).

In still further embodiments, the forming of the second resist layer includes forming a third resist layer that is stacked on the second resist layer and has an overhang that protrudes into the first opening and the second opening.

In still further embodiments, if the third resist layer is formed of the same material as the first resist layer, the third resist layer is formed thicker than the first resist layer.

In still further embodiments, the forming of the first and second resist layers includes: exposing the first and second resist layers of a first region adjacent to the source electrode; exposing the second resist layer of a second region adjacent to the drain electrode; and simultaneously forming a first opening exposing the dielectric layer in the first region and a second opening exposing the first resist layer in the second region.

In still further embodiments, the methods further include removing the capping layer in the bottom of the first opening.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
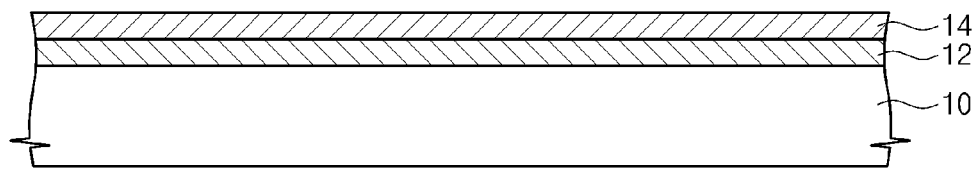
FIGS. 1 to 10 are sectional views illustrating methods for fabricating an FET according to exemplary embodiments of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, like reference numerals refer to like elements.

It will be understood that when a layer (or film) is referred to as being on another layer or substrate, it can be directly on the other layer or substrate, or one or more intervening layers may also be present. It will also be understood that when a layer is referred to as being 'under' another layer, it can be directly under the other layer, or one or more intervening layers may also be present. It will also be understood that when a layer is referred to as being 'between' two layers, it can be the only layer between the two layers, or one or more intervening layers may also be present. Also, though terms like first, second, and third are used to describe various regions and layers in various embodiments of the present invention, the regions and the layers are not limited to these terms. These terms are used only to discriminate one region or layer from another region or layer. Therefore, a region (or layer) referred to as a first region (or layer) in one embodiment may be referred to as a second region (or layer) in another embodiment. As used herein, the term and/or includes any and all combinations of one or more of the associated listed items.

FIGS. 1 to 10 are sectional views illustrating methods for fabricating an FET according to exemplary embodiments of the present invention.

Referring to FIG. 1, an active layer 12 and a capping layer 14 are formed on a substrate 10. The substrate 10 may include a semiconductor substrate formed of gallium arsenide (GaAs), indium phosphide (InP), gallium nitride (GaN), silicon-germanium (SiGe), silicon carbide (SiC), or indium-gallium-arsenic (InGaAs). The substrate 10 may further include a dielectric substrate formed of glass, sapphire, or quartz. A supper lattice layer may be formed between the substrate 10 and the active layer 12. The supper lattice layer includes a material that reduces lattice mismatches and traps defects (e.g., dislocations). For example, the supper lattice layer includes epitaxial indium-aluminum-arsenic (InAlAs) or GaAs. The active layer 12 may be formed through an epitaxy process including a Molecular Beam Epitaxy (MBE) process or a Metal-Organic Chemical Vapor Deposition (MOCVD) process. The active layer 12 may include a stack structure of a channel layer, a buffer layer and a barrier layer.

Although not illustrated in FIG. 1, the channel layer is a region of an FET that causes a movement of electric charges (or electrons). The channel layer may include a two-dimensional electron gas (2DEG) region. For example, the channel layer includes undoped epitaxial InGaAs. The buffer layer may include a spacer layer and a charge supply layer. The spacer layer may include InAlAs and may be formed thinner than the channel layer. The charge supply layer may supply electric charges that penetrate through the spacer layer and transfer to the channel layer. For example, the charge supply layer includes an aluminum-gallium-arsenic (n+AlGaAs) layer or a silicon layer (Si planar doping) doped with n-type conductive impurities. The barrier layer may be used in a semiconductor device including an FET requiring a high operation speed. For example, the barrier layer includes InAlAs that is one of wide band gap ternary compound semiconductor materials forming a Schottky junction (i.e., a junction between a semiconductor layer and a metal contacting the semiconductor layer).

The capping layer 14 may be an ohmic layer that forms an ohmic contact with a source electrode and a drain electrode to reduce the contact resistance. For example, the capping layer 14 includes InGaAs doped with n-type conductive impurities.

Figure 2:
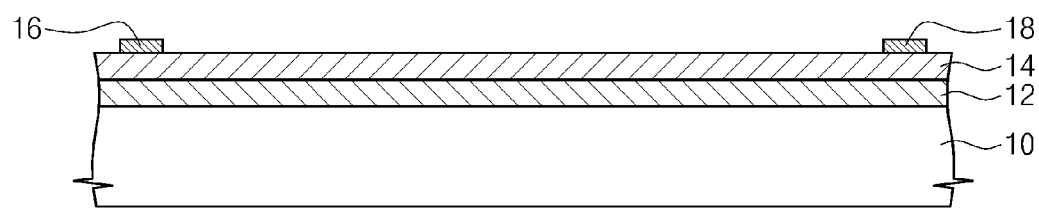

Referring to FIG. 2, a source electrode 16 and a drain electrode 18 is formed on the capping layer 14. The source electrode 16 and the drain electrode 18 are spaced apart from each other. The source electrode 16 and the drain electrode 18 may be formed of a metal layer including at least one of germanium (Ge), aurum (Au), nickel (Ni), titanium (Ti) and aluminum (Al) doped with conductive impurities. For example, if the active layer 12 is formed of GaN, the source electrode 16 and the drain electrode 18 are formed of a stack structure of Ti, Al, Ni and Au. If the active layer 12 is formed of GaAs, the source electrode 16 and the drain electrode 18 are formed of a stack structure of Au—Ge alloy, Ni and Au. The source electrode 16 and the drain electrode 18 may include a metal layer formed through a sputtering process, an evaporation process, or a Molecular Beam Epitaxy (MBE) process. The source electrode 16 and the drain electrode 18 may be formed through a photography process, a metal deposition process, and a lift-off process. The source electrode 16 and the drain electrode 18 may be diffused by a Rapid Thermal Annealing (RTA) process to a depth below the active layer 12. The RTA process may be performed under a nitrogen atmosphere in a temperature range of about 230° C. to 250° C.

Figure 3:
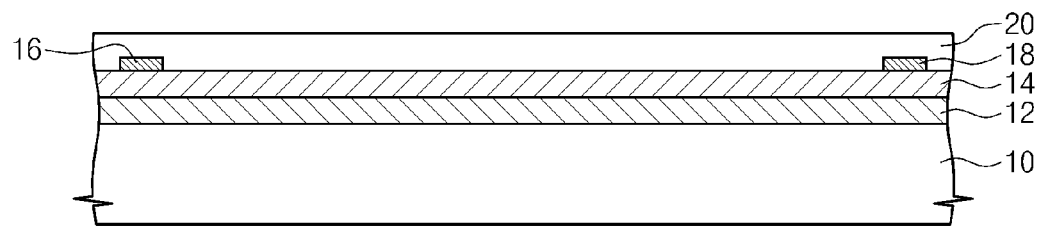

Referring to FIG. 3, a dielectric interlayer 20 is formed over the substrate 10 overall. Herein, the dielectric interlayer 20 may include a silicon oxide layer, a silicon nitride layer, a benzocyclobutene (BCB) polymer, or a porous silica gel. The silicon oxide layer and the silicon nitride layer may be formed through a Chemical Vapor Deposition (CVD) process. The BCB and the porous silica gel may be formed by a printing process or a spin coating process.

Figure 4:
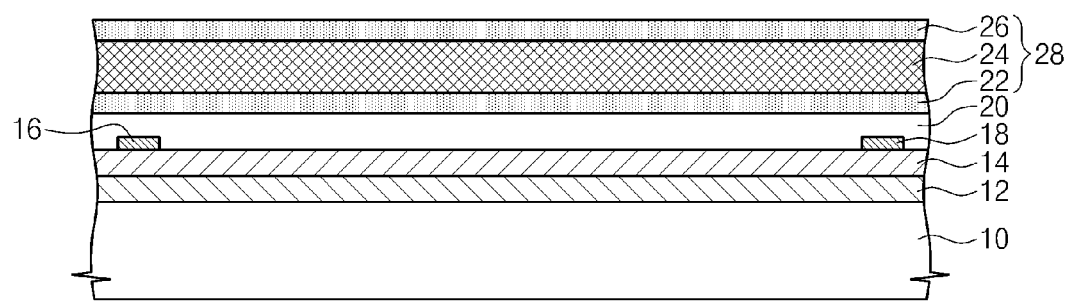

Referring to FIG. 4, a resist layer 28 is formed on the dielectric interlayer 20. For example, the resist layer 28 includes first to third resist layers 22, 24 and 26. The first to third resist layers 22, 24 and 26 may be formed by a spin coating process. Also, each of the first to third resist layers 22, 24 and 26 may be hardened by a bake process. The first to third resist layers 22, 24 and 26 may be high in hydrophilicity and flexibility. For example, the first to third resist layers 22, 24 and 26 is formed as PMMA (polymethyl methacraylate)/Co-polymer/PMMA stack structure or a ZEP/PMGI/ZEP stack structure. The second resist 24 may be formed of a different material than the first resist layer 22 and the third resist layer 26. The first resist layer 22 and the third resist layer 26 may be formed of the same material. The third resist layer 26 may be formed thicker than the first resist layer 22.

Figure 5:
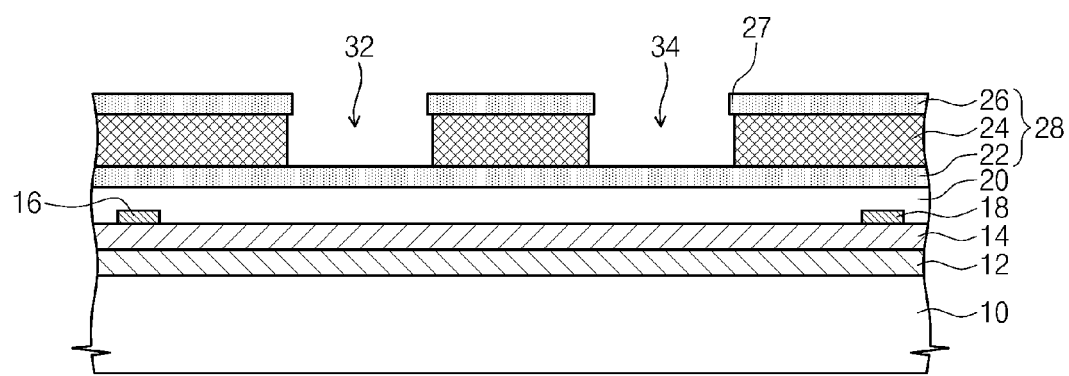

Referring to FIG. 5, the second and third resist layers 24 and 26 on the dielectric interlayer 20 between the source electrode 16 and the drain electrode 18 may be patterned to form a first opening 32 and a second opening 34. The second resist layer 24 and the third resist layer 26 may be exposed by electron beams (e-beams). The electron beams may be incident at a dose and energy that penetrates through the third resist layer 26 and arrives at the second resist layer 24. Thereafter, the second and third resist layers 24 and 26 exposed to the electron beams may be removed by a developer to form the first opening 32 and the second opening 34. The first opening 32 and the second opening 34 may be formed to the same depth to expose the first resist layer 22. A region of the first opening 32 may be defined as a first region, and a region of the second opening 34 may be defined as a second region. In this case, the third resist layer 26 may be formed to have an overhang 27 that protrudes inward from the edge top of the first opening 32 and the second opening 34.

Figure 6:
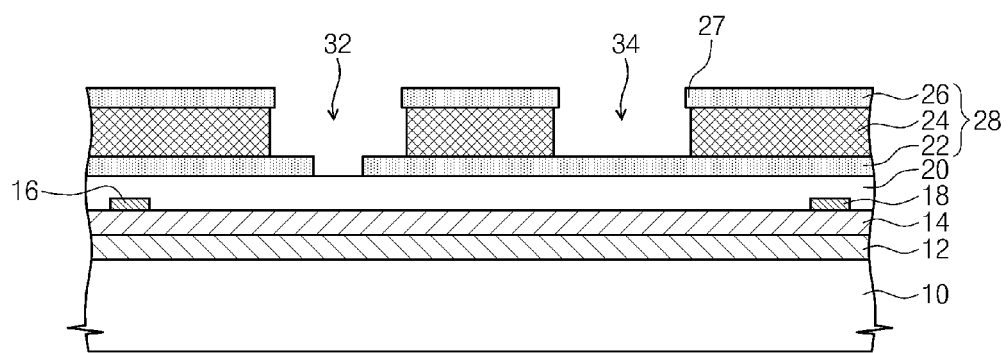

Referring to FIG. 6, the first resist layer 22 in the bottom of the first opening 32 may be removed by a linewidth smaller than the inlet of the first opening 32, to expose the dielectric interlayer 20. Herein, the first resist layer 22 may be patterned by being exposed by electron beams and then developed. Thus, the first opening 32 and the second opening 34 may be formed to different depths. That is, the first to third resist layers 22, 24 and 26 may be patterned to asymmetrical depths in the first region and the second region. Thus, the first to third resist layers 22, 24 and 26 may undergo two exposure processes and two development processes to form the first opening 32 and the second opening 34 that have asymmetrical depths.

The first opening 32 and the second opening 34 may be formed to asymmetrical depths through a single lithography process including an exposure process and a development process. The first to third resist layers 22, 24 and 26 may be exposed asymmetrically in the first region and the second region by electron beams with different doses and energy levels. The first to third resist layers 22, 24 and 26 of the first region may be exposed to an electron beam of a first dose and a first energy level. The second and third resist layers 24 and 26 of the second region may be exposed to an electron beam of a second dose and a second energy level. The second dose is less than the first dose, and The second energy level is less than the first energy level. Thereafter, the first to third resist layers 22, 24 of the first region and the second and third resist layers 24 and 26 of the second region may be developed. Thus, the first opening 32 may be formed in the first region to expose the dielectric interlayer 20, and the second opening 34 may be formed in the second region to expose the first resist layer 22.

Figure 7:
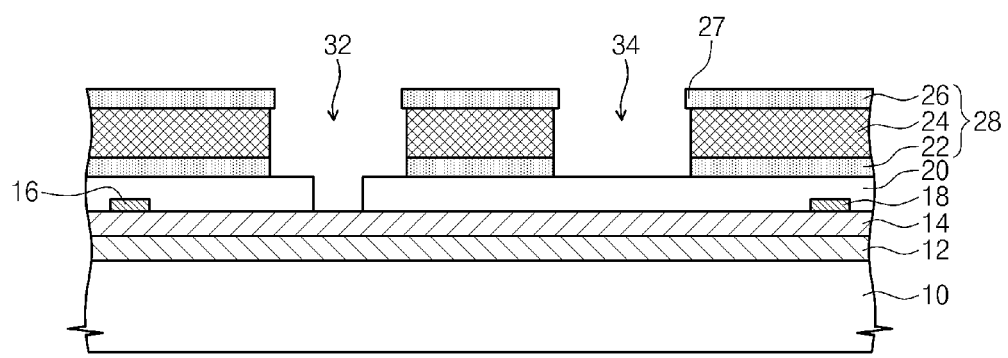

Referring to FIG. 7, the dielectric interlayer 20 exposed in the bottom of the first opening 32 and the first resist layer 22 exposed in the bottom of the second opening 34 may be removed simultaneously. Herein, the dielectric interlayer 20 and the first resist layer 22 may be etched by a dry etching process such as Reactive Ion Etching (RIE), Magnetic Reactive Ion Etching (MRIE), and Inductively Coupled Plasma Etching (ICPE). The dry etching process may be performed adaptively according to the types or thicknesses of the dielectric interlayer 20 and the first resist layer 22.

If the dielectric interlayer 20 and the first resist layer 22 are formed to the same thickness, the dry etching process using a reaction gas that provides the same etch selectivity with respect to the dielectric interlayer 20 and the first resist layer 22 may be performed. For example, the reaction gas includes carbon tetrafluoride ($CF_4$). The dielectric interlayer 20 formed of a BCB polymer containing an organic material and the first resist layer 22 formed of a PMMA may have similar etch selectivity with respect to a $CF_4$ reaction gas. Thus, the dielectric interlayer 20 and the first resist layer 22 may be simultaneously removed from the first opening 32 and the second opening 34 by a dry etching process.

The dielectric interlayer 20 formed of a silicon oxide and the first resist layer 22 formed of a PMMA may have different etch selectivity with respect to $CF_4$. The dielectric interlayer 20 and the first resist layer 22 may be formed to different thicknesses and may be removed through dry etching processes using reaction gases with different etch selectivity. For example, if the dielectric interlayer 20 and the first resist layer 22 are formed with a thickness ratio of about 2:1, the dry etching processes may be performed using reaction gases that provide an etch selectivity ratio of about 2:1 with respect to the dielectric interlayer 20 and the first resist layer 22. Thus, the dry etching process may be performed by using a reaction gas that provides an etch selectivity being proportional to the thickness of the dielectric interlayer 20 and the first resist layer 22.

The first resist layer 22 left at the edge of the bottom of the first opening 32 may be removed to expose the top surface of the dielectric interlayer 20. The bottom of the first opening 32 may expose the capping layer 14 and the dielectric interlayer 20. As described above, the second opening 34 may expose the dielectric interlayer 20. The first opening 32 may be formed to have a "T" shape, and the second opening 34 may be formed to have a rectangular shape. If the third resist layer 26 is formed of the same material as the first resist layer 22, it may be removed in the etching process. Thus, the third resist layer 26 may be formed thicker than the first resist layer 22. The third resist layer 26 may be left on the substrate 10 after the etching process.

Figure 8:
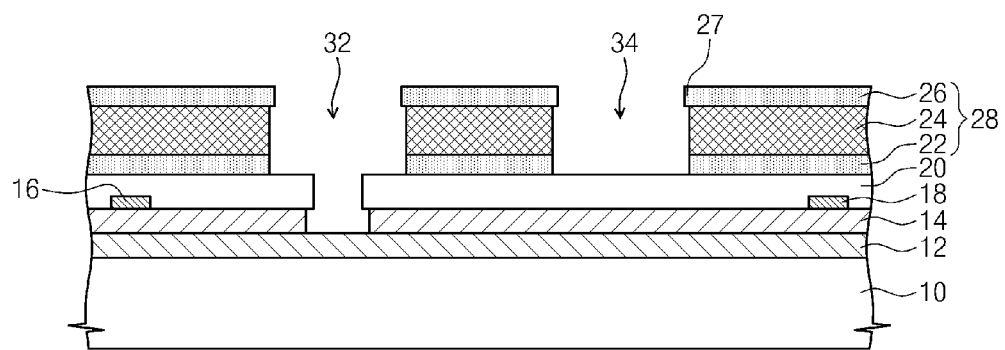

Referring to FIG. 8, the capping layer 14 exposed in the bottom of the first opening 32 may be removed to expose the active layer 12. The capping layer 14 may be removed by a wet etching process. The wet etching process may isotropically remove the capping layer 14 exposed in the bottom of the first opening 32. Thus, the bottom of the first opening 32 may extend to the bottom of the dielectric interlayer 20. The wet etching process may be performed by using a succinic acid and a hydrochloric acid as an etchant. With respect to the etchant, the capping layer 14 may have a higher etch selectivity than the dielectric interlayer 20. In this case, the wet etching process may determine the thickness of the active layer 12 exposed in the bottom of the first opening 32. The mode of an FET may be determined according to the depth of the active layer 12 exposed in the bottom of the first opening 32. If the barrier layer of the active layer 12 is thick, a depletion-mode FET may be fabricated, and if the barrier layer of the active layer 12 is thin, an enhancement-mode FET may be fabricated.

Figure 9:
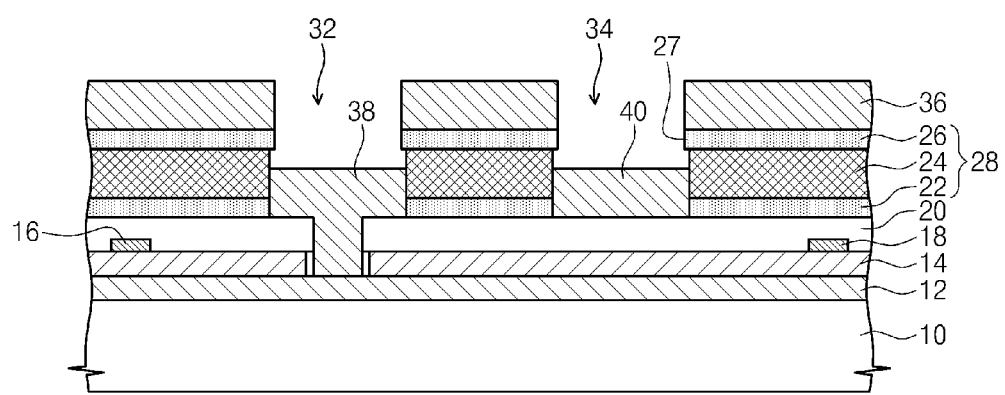

Referring to FIG. 9, a metal layer may be formed on the substrate 10. The metal layer may include a stack structure of titanium (Ti), platinum (Pt) and aurum (Au). The metal layer may further include at least one of molybdenum (Mo), tungsten (W), nickel (Ni), cobalt (Co) and palladium (Pd). The metal layer may be formed through a sputtering process, an evaporation process, or a MBE process. In this case, the overhang 27 may isolate first metal layers 38 and 40 formed in the first and second openings 32 and 34 and a second metal layer 36 formed on the third resist layer 26. The first metal layer may be formed as a gate electrode 38 with a "T"-shaped section in the first opening 32. Also, the first metal layer may be formed as a field plate 40 with a rectangular section in the second opening 34. The head of the gate electrode 38 may be formed on the dielectric interlayer 20, and the field plate 40 may be formed on the same level. The height of the gate electrode 38 may be determined according to the thicknesses of the dielectric interlayer 20 and the capping layer 14. The gate electrode 38 and the capping layer 14 may be formed to be spaced apart from each other by a predetermined distance. The gate electrode 38 may be formed in the active layer to have a small gate length and a large section, so that it may be formed to have a reduced gate resistance.

Therefore, the FET fabrication method according to the embodiment of the present invention can simultaneously form the gate electrode 38 and the field plate 40, which have asymmetrical levels, by depositing the metal layer on the substrate 10. Thus the FET fabrication method according to the embodiment of the present invention makes it possible to improve the productivity.

Figure 10:
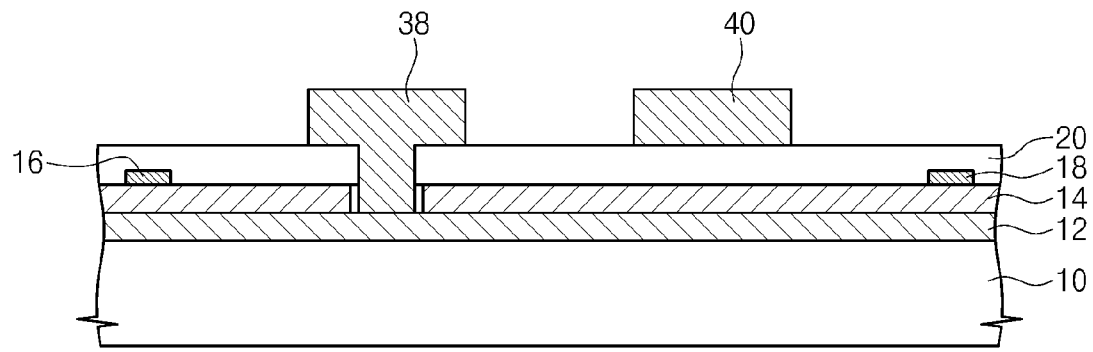

Referring to FIG. 10, the first to third resist layers 22, 24 and 26 may be removed to lift off the second metal layer 36. The first to third resist layers 22, 24 and 26 may be removed by volatilization. Thus, the second metal layer 36 on the first to third resist layers 22, 24 and 26 may be lifted off and removed from the substrate 10. At this point, the gate electrode 38 and the field plate 40 may be left on the substrate 10.

In the result, the FET fabrication method according to the embodiments of the present invention may form the first and second openings 32 and 34 with asymmetrical depths in the stacked first to third resist layers 22, 24 and 26. For example, the first opening 32 may expose the dielectric interlayer 20, and the second opening 34 may expose the first resist layer 22. Thereafter, the dielectric interlayer 30 of the first opening 32 and the resist layer of the second opening 34 may be simultaneously removed by a dry etching process to expose the capping layer 14 in the first opening 32 and expose the dielectric interlayer 20 in the second opening 34. Thereafter, the capping layer 14 in the first opening 32 may be removed to expose the active layer 12. The metal layer 36 is formed on the substrate 10 to simultaneously form the gate electrode 38 in the first opening 32 and the field plate 40 in the second opening 34, thus making it possible to increase or maximize the productivity.

As described above, the embodiments of the present invention can simultaneously form the gate electrode 38 and the field plate 40 in the first and second openings 32 and 34, which are formed to asymmetrical depths on the dielectric interlayer 20 between the source electrode 16 and the drain electrode 18, thus making it possible to increase or maximize the productivity.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for fabricating a field effect transistor, comprising:

stacking an active layer and a capping layer on a substrate;

forming a source electrode and a drain electrode on the capping layer;

sequentially forming a dielectric layer and a first resist layer on the substrate;

forming a second resist layer with first and second openings on the first resist layer between the source electrode and the drain electrode;

exposing the dielectric layer by removing the first resist layer in the bottom of the first opening, which is adjacent to the source electrode, by a linewidth smaller than the inlet of the first opening;

removing the dielectric layer in the bottom of the first opening and the first resist layer in the bottom of the second opening to expose the capping layer to the first opening and expose the dielectric layer to the second opening; and forming a gate electrode and a field plate respectively in the first opening and the second opening.

2. The method of claim 1, wherein the dielectric layer and the first resist layer are removed by a dry etching process.

3. The method of claim 2, wherein the dry etching process is performed by using a reaction gas with an etch selectivity being proportional to the thickness of the dielectric layer and the first resist layer.

4. The method of claim 3, wherein the reaction gas includes carbon tetrafluoride.

5. The method of claim 2, wherein the dielectric layer includes at least one of a silicon oxide layer, a silicon nitride layer, a benzocyclobutene (BCB) polymer, and a silica gel.

6. The method of claim 2, wherein the first resist layer includes at least one of PMMA (polymethyl methacraylate) and a copolymer of chloromethacrylate and methylstyrene.

7. The method of claim 1, wherein the forming of the second resist layer comprises forming a third resist layer that is stacked on the second resist layer and has an overhang that protrudes into the first opening and the second opening.

8. The method of claim 7, wherein if the third resist layer is formed of the same material as the first resist layer, the third resist layer is formed thicker than the first resist layer.

9. The method of claim 1, wherein the forming of the first and second resist layers comprises:

exposing the first and second resist layers of a first region adjacent to the source electrode;

exposing the second resist layer of a second region adjacent to the drain electrode; and simultaneously forming a first opening exposing the dielectric layer in the first region and a second opening exposing the first resist layer in the second region.

10. The method of claim 1, further comprising removing the capping layer in the bottom of the first opening.

\* \* \* \* \*